(12) United States Patent
Pan et al.

(10) Patent No.: US 9,107,301 B2
(45) Date of Patent: Aug. 11, 2015

(54) FOLDABLE ELECTRONIC DEVICE

(71) Applicants: Hung-Sung Pan, Taipei (TW);
Chung-Hao Kuo, Taipei (TW); Jui-Wen
Chou, Taipei (TW); Hung-Jui Lin,
Taipei (TW); Tzu-Chien Lai, Taipei
(TW); Hsin Yeh, Taipei (TW);
Long-Cheng Chang, Taipei (TW);
Chuang-Yueh Chen, Taipei (TW);
Po-Chin Yu, Taipei (TW); Chuan-Hao
Wen, Taipei (TW); Yung-Hsiang Chen,
Taipei (TW); Ting-Wei Wu, Taipei
(TW); Hui-Lian Chang, Taipei (TW);
Ming-Wang Lin, Taipei (TW);
Jui-Yuan Lee, Taipei (TW)

(72) Inventors: Hung-Sung Pan, Taipei (TW);
Chung-Hao Kuo, Taipei (TW); Jui-Wen
Chou, Taipei (TW); Hung-Jui Lin,
Taipei (TW); Tzu-Chien Lai, Taipei
(TW); Hsin Yeh, Taipei (TW);
Long-Cheng Chang, Taipei (TW);
Chuang-Yueh Chen, Taipei (TW);
Po-Chin Yu, Taipei (TW); Chuan-Hao
Wen, Taipei (TW); Yung-Hsiang Chen,
Taipei (TW); Ting-Wei Wu, Taipei
(TW); Hui-Lian Chang, Taipei (TW);
Ming-Wang Lin, Taipei (TW);
Jui-Yuan Lee, Taipei (TW)

(73) Assignee: COMPAL ELECTRONICS, INC.,
Taipei (TW)

( * ) Notice: Subject to any disclaimer, the term of this
patent is extended or adjusted under 35
U.S.C. 154(b) by 122 days.

(21) Appl. No.: 13/688,182

(22) Filed: Nov. 28, 2012

(65) Prior Publication Data
US 2013/0170124 A1 Jul. 4, 2013

Related U.S. Application Data

(60) Provisional application No. 61/581,633, filed on Dec. 30, 2011.

(51) Int. Cl.
G06F 1/16 (2006.01)
H05K 5/02 (2006.01)

(52) U.S. Cl.
CPC ............ H05K 5/0226 (2013.01); G06F 1/1616
(2013.01); G06F 1/1618 (2013.01); G06F
1/1681 (2013.01); G06F 1/1688 (2013.01);
G06F 1/1698 (2013.01)

(58) Field of Classification Search
CPC ... G06F 1/1618; G06F 1/1633; G06F 1/1637;
G06F 1/1643; G06F 1/3262; G06F 3/03542;
G06F 3/03545; G06F 1/1632; G06F 1/1681;
G06F 17/5009; G06F 1/1616; G06F 1/1626;
G06F 2200/1633; G06F 17/00; G06F
17/30047; G06F 17/30241; G06F 17/30259;
G06F 17/5004; G06F 17/5068; G06F 19/322;
G06F 1/1679; G06F 1/1688; G06F 1/169;
G06F 1/1694; G06F 1/1698; G06F 2200/1637;
G06F 3/03; G06F 1/1628; G06F 1/1669;
G06F 1/1652; G06F 1/1615; G06F 1/1641;
G06F 1/1683; H05K 5/0217; H05K 5/0226;
H05K 2201/10128; H05K 7/00; H05K 7/02;
H05K 7/14; H05K 7/1491
USPC ............. 361/679.01, 679.02, 679.08, 679.09,
361/679.21, 679.26, 679.27, 724–727,
361/679.55–679.58; 248/917–924;
455/575.1–575.4; 379/433.11–433.13;
345/168–173
See application file for complete search history.

(56) References Cited

U.S. PATENT DOCUMENTS 3,803,668 A * 4/1974 Remick .......................... 16/380
5,410,447 A * 4/1995 Miyagawa et al. ....... 361/679.09
6,853,336 B2 * 2/2005 Asano et al. .................. 343/702
7,058,433 B2 * 6/2006 Carpenter .................. 455/575.1
7,426,114 B2 * 9/2008 Nakatani et al. .............. 361/752
8,289,688 B2 * 10/2012 Behar et al. ................ 361/679.3

| | | | |
|---|---|---|---|
| 2003/0112589 | A1* | 6/2003 | Shimano et al. .............. 361/683 |
| 2008/0307608 | A1* | 12/2008 | Goto ................................ 16/366 |
| 2009/0244832 | A1 | 10/2009 | Behar et al. |

FOREIGN PATENT DOCUMENTS

| TW | I279494 | 4/2007 |
|---|---|---|
| TW | 201022882 | 6/2010 |
| TW | I339328 | 3/2011 |

OTHER PUBLICATIONS

"Office Action of Taiwan Counterpart Application", issued on Nov. 13, 2014, p. 1-p. 11.

\* cited by examiner

*Primary Examiner* — Anthony Haughton
*Assistant Examiner* — Ingrid Wright

(74) *Attorney, Agent, or Firm* — Jianq Chyun IP Office

(57) ABSTRACT

A foldable electronic device includes a first body, a second body and a hinge body. The hinge body is pivoted to the first body around a first pivoting axis and pivoted to the second body around a second pivoting axis so that the first body is able to rotate relatively to the second body. When the first body rotates to a first position relatively to the second body, a first front surface of the first body is closed to a second front surface of the second body on a closing plane, and a pivoting plane where the first pivoting axis and the second pivoting axis are located on and the closing plane are oblique to each other.

19 Claims, 8 Drawing Sheets

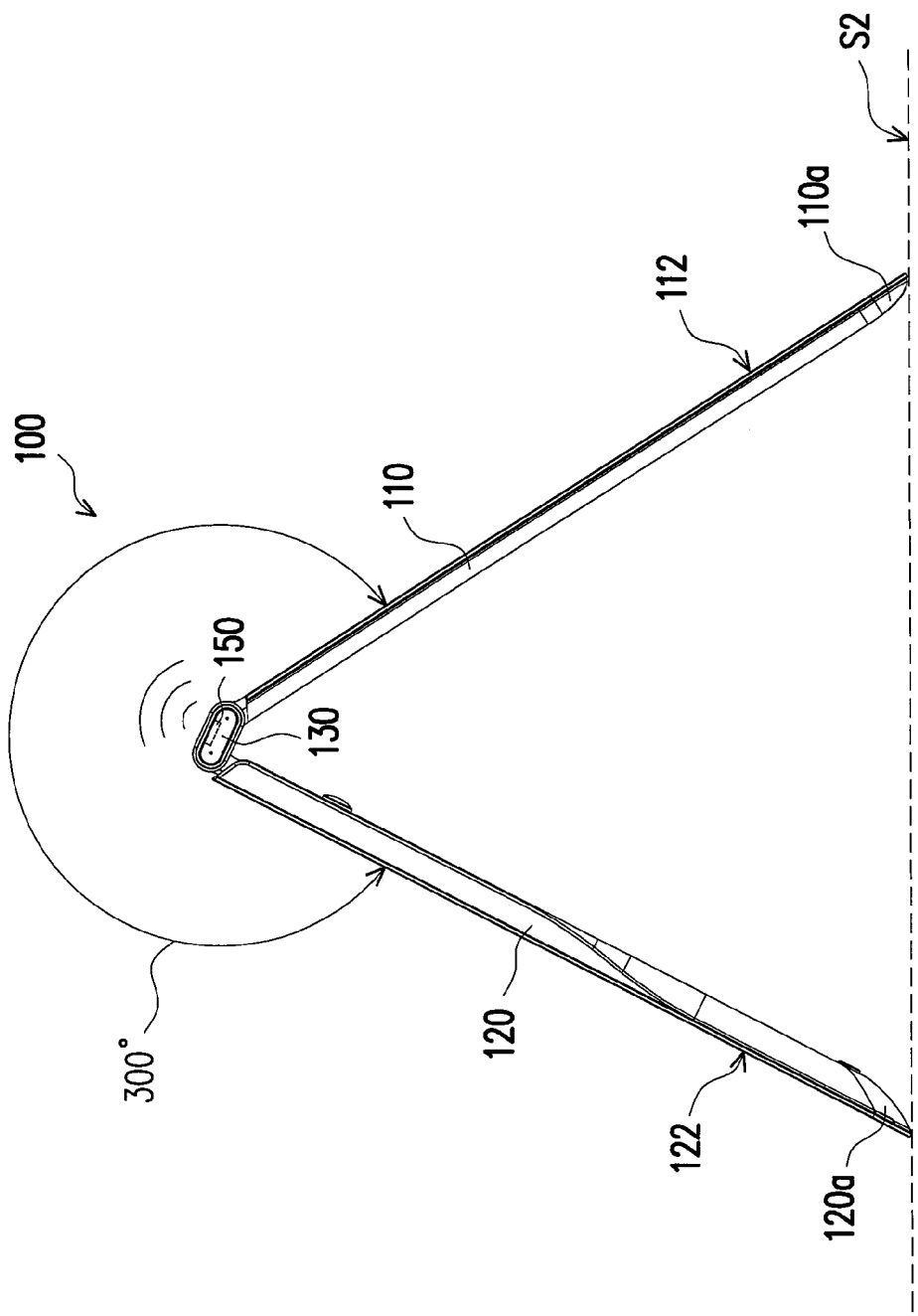

FOLDABLE ELECTRONIC DEVICE

CROSS-REFERENCE TO RELATED APPLICATION

This application claims the priority benefits of U.S. provisional application Ser. No. 61/581,633, filed on Dec. 30, 2011. The entirety of the above-mentioned patent applications is hereby incorporated by reference herein and made a part of this specification.

BACKGROUND

1. Field of the Disclosure

The disclosure generally relates to an electronic device, and more particularly, to a foldable electronic device with different usage modes achieved by rotation.

2. Description of Related Art

With the advent of ever-changing technology and various portable devices, the user can process, receive and send out data at anytime and anywhere through an electronic device such as notebook computer and tablet computer. Thus, the electronic devices have become indispensable essential articles for the modern people in living.

In terms of notebook computer, it mainly includes a monitor and a host, in which the monitor and the host are usually connected to each other through a pivot mechanism, and when the user opens or closes the notebook computer, the display and the host can rotate relative to each other by means of the pivoting mechanism. However, although a variety of usage states with the notebook computer has been developed, but the location of the speaker in a notebook computer is mostly fixed, so that it will reduce the music playing quality under some usage states.

SUMMARY OF THE DISCLOSURE

Accordingly, the disclosure is directed to a foldable electronic device with different usage modes achieved by rotating to several angles.

The disclosure is further directed to a foldable electronic device, wherein the speaker is disposed at a pivoting mechanism to ensure the good audio effect of the speaker under usage state.

The disclosure provides a foldable electronic device, which includes a first body, a second body and a hinge body. The hinge body is pivoted to the first body around a first pivoting axis and pivoted to the second body around a second pivoting axis so that the first body is able to rotate relatively to the second body. When the first body rotates to a first position relatively to the second body, a first front surface of the first body is closed to a second front surface of the second body on a closing plane, and a pivoting plane where the first pivoting axis and the second pivoting axis are located on and the closing plane are oblique to each other.

In an embodiment of the disclosure, when the first body rotates to the first position relatively to the second body, the orthogonal projection of the front edge of the first body on the closing plane and the orthogonal projection of the front edge of the second body on the closing plane are aligned with each other.

In an embodiment of the disclosure, the first body has a first back surface opposite to the first front surface, the second body has a second back surface opposite to the second front surface, when the first body rotates to a second position relatively to the second body, the first back surface of the first body is borne at the second back surface of the second body on a bearing plane, and the pivoting plane and the bearing plane are oblique to each other.

In an embodiment of the disclosure, when the first body rotates to the second position relatively to the second body, the orthogonal projection of the front edge of the first body on the bearing plane is protruded from the orthogonal projection of the front edge of the second body on the bearing plane.

In an embodiment of the disclosure, the foldable electronic device further includes an antenna model disposed at the front edge of the first body.

In an embodiment of the disclosure, the foldable electronic device further includes a speaker disposed at the hinge body, in which when the first body rotates to the first position relatively to the second body, the speaker is hidden, while when the first body rotates relatively to the second body to make the included angle between the first front surface of the first body and the second front surface of the second body greater than 0°, the speaker is exposed.

In an embodiment of the disclosure, when the first body rotates relatively to the second body to make the included angle between the first front surface of the first body and the second front surface of the second body greater than 0° but less than 180°, the first body, the second body and the hinge body are present in an NB mode.

In an embodiment of the disclosure, when the first body rotates relatively to the second body to make included angle between the first front surface of the first body and the second front surface of the second body greater than 180° but less than 360°, the first body, the second body and the hinge body are present in a show off mode.

In an embodiment of the disclosure, the first body has a display at the first front surface and the second body has a keyboard at the second front surface.

The disclosure further provides a foldable electronic device, which includes a first body, a second body and a hinge body. The hinge body has an electronic component, in which the hinge body is pivoted to the first body around a first pivoting axis and pivoted to the second body around a second pivoting axis so that the first body is able to rotate relatively to the second body.

In an embodiment of the disclosure, the electronic component is a speaker. When the first body rotates to a first position relatively to the second body, the speaker is hidden. When the first body rotates relatively to the second body to make the included angle between a first front surface of the first body and a second front surface of the second body greater than 0°, the speaker is exposed.

In an embodiment of the disclosure, when the first body rotates relatively to the second body to make the included angle between the first front surface of the first body and the second front surface of the second body greater than 0° but less than 180°, the first body, the second body and the hinge body are present in an NB mode.

In an embodiment of the disclosure, when the first body rotates relatively to the second body to make included angle between the first front surface of the first body and the second front surface of the second body greater than 180° but less than 360°, the first body, the second body and the hinge body are present in a show off mode.

In an embodiment of the disclosure, when the first body rotates to a first position relatively to the second body, a first front surface of the first body is closed to a second front surface of the second body on a closing plane.

In an embodiment of the disclosure, when the first body rotates to the first position relatively to the second body, orthogonal projection of the front edge of the first body on the closing plane and orthogonal projection of the front edge of the second body on the closing plane are aligned with each other.

In an embodiment of the disclosure, the first body has a first back surface opposite to the first front surface, the second body has a second back surface opposite to the second front surface, when the first body rotates to a second position relatively to the second body, the first back surface of the first body is borne at the second back surface of the second body on a bearing plane.

In an embodiment of the disclosure, when the first body rotates to the second position relatively to the second body, the orthogonal projection of the front edge of the first body on the bearing plane is protruded from the orthogonal projection of the front edge of the second body on the bearing plane.

In an embodiment of the disclosure, the foldable electronic device further includes an antenna model disposed at the front edge of the first body.

In an embodiment of the disclosure, the first body has a display at the first front surface and the second body has a keyboard at the second front surface.

Based on the description above, in the foldable electronic device of the disclosure, by means of the pivoting axes in pairs and the oblique pivoting plane, the first body can rotate to any angle relatively to the second body. In this way, the rotation angle between the two bodies can be adjusted to provide a user with different operation modes. In addition, in the disclosure, a speaker is further disposed at the hinge body so that the speaker will not be obscured by the bodies with the rotating of the first body relatively to the second body, and the speaker can sound facing the user depending on the usage state to ensure the good audio effect of the speaker in the usage state.

In order to make the features and advantages of the present disclosure more comprehensible, the present disclosure is further described in detail in the following with reference to the embodiments and the accompanying drawings.

BRIEF DESCRIPTION OF THE DRAWINGS

FIG. 3B is a side-view diagram of the foldable electronic device of FIG. 3A in show off mode.

DESCRIPTION OF THE EMBODIMENTS

Figure 1A:
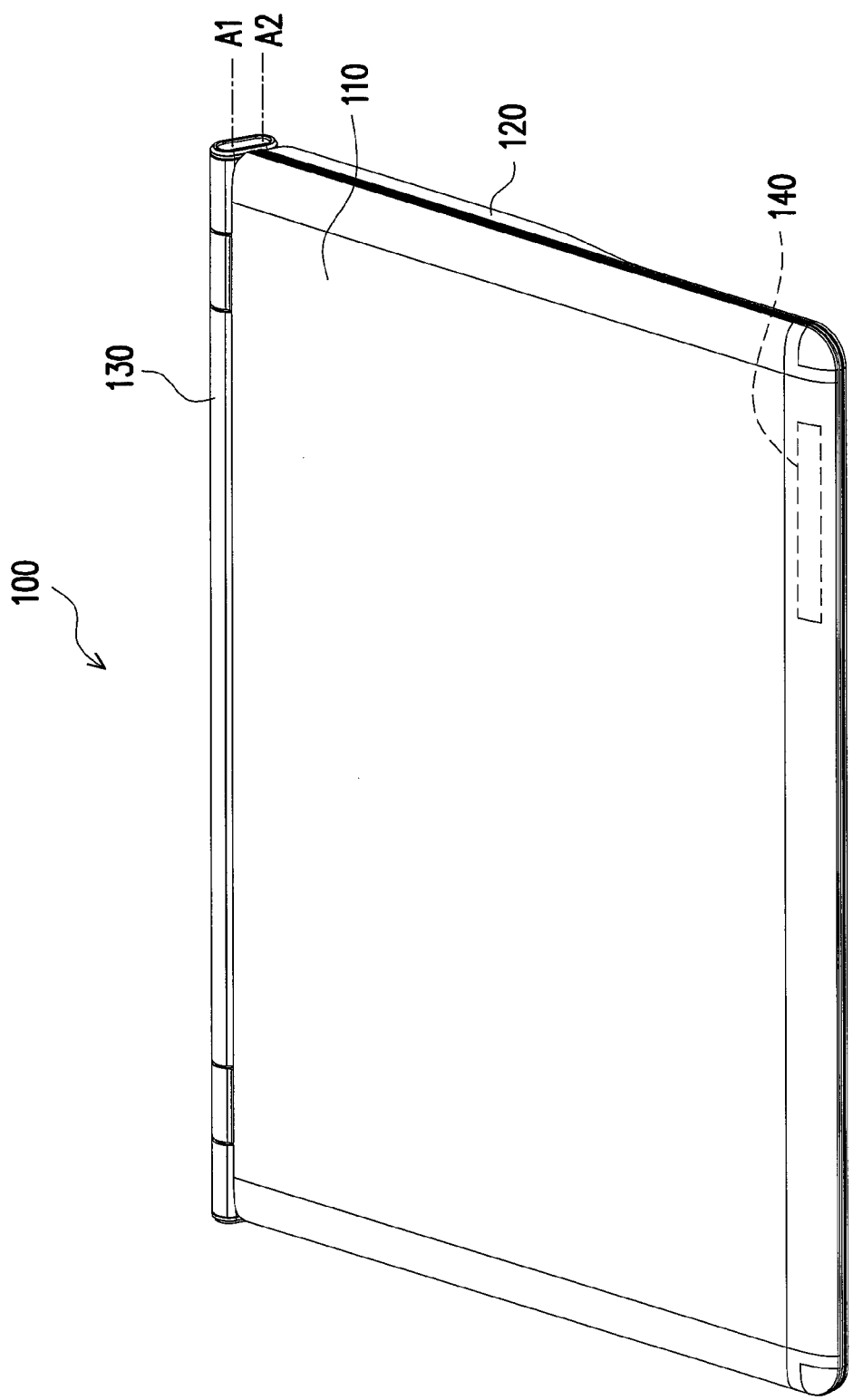
FIG. 1A is a schematic diagram of a foldable electronic device in closing mode according to an embodiment of the disclosure.
Figure 1B:
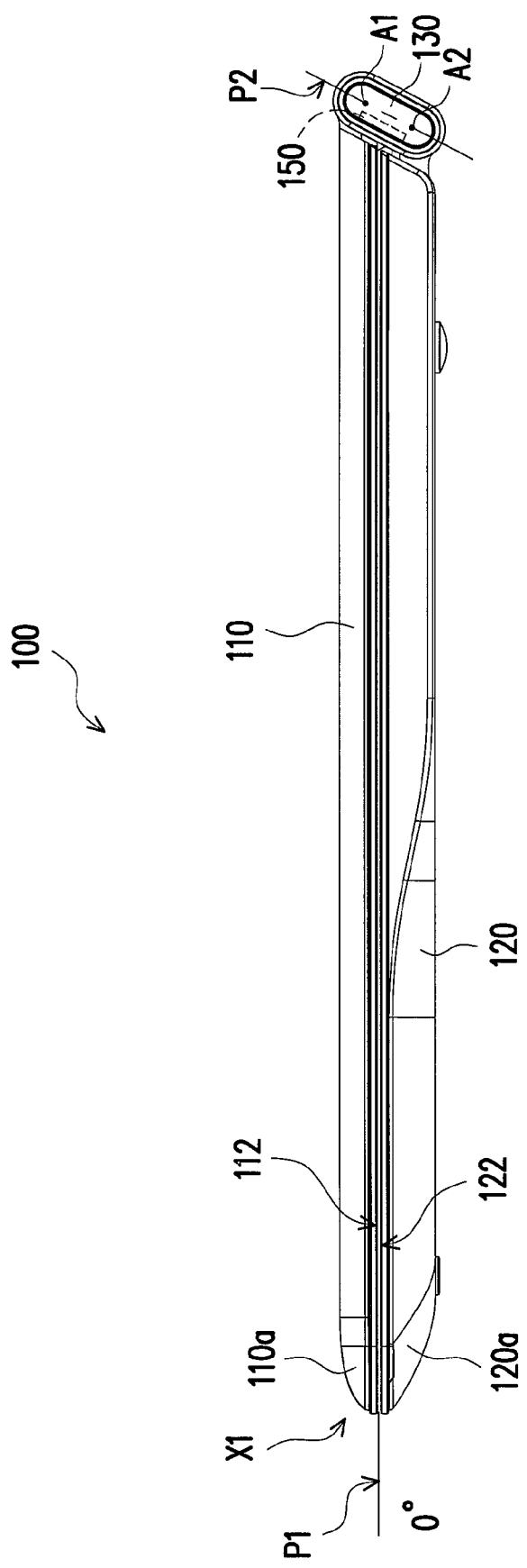
FIG. 1B is a side-view diagram of the foldable electronic device of FIG. 1A in closing mode.

FIG. 1A is a schematic diagram of a foldable electronic device in closing mode according to an embodiment of the disclosure and FIG. 1B is a side-view diagram of the foldable electronic device of FIG. 1A in closing mode. Referring to FIGS. 1A and 1B, a foldable electronic device 100 includes a first body 110, a second body 120 and a hinge body 130. The hinge body 130 is pivoted to the first body 110 around a first pivoting axis A1 and is pivoted to the second body 120 around the second pivoting axis A2. Thus, by means of the design of the pivoting axes A1 and A2 in pairs, in the embodiment, the first body 110 is able to rotate relatively to the second body 120 so as to open or close the foldable electronic device 100 with different operation modes.

When the first body 110 rotates to a first position X1 relatively to the second body 120, a first front surface 112 of the first body 110 is closed to a second front surface 122 of the second body 120 on a closing plane P1 to make the included angle between the first front surface 112 of the first body 110 and the second front surface 122 of the second body 120 equal to 0°. As a result, the first body 110, the second body 120 and the hinge body 130 are present in closing mode. In addition, the length of the first body 110 in the embodiment is greater than the length of the second body 120, and a pivoting plane P2 where the first pivoting axis A1 and the second pivoting axis A2 are located at and the closing plane P1 are oblique to each other. Therefore, when the first body 110 rotates to the first position X1 relatively to the second body 120, the orthogonal projection of the front edge 110a of the first body 110 on the closing plane P1 and the orthogonal projection of the front edge 120a of the second body 120 on the closing plane P1 are aligned with each other without protruding from the front edge 120a of the second body 120. In other embodiments, the pivoting plane where the first pivoting axis and the second pivoting axis are located at and the closing plane are perpendicular to each other, which the disclosure is not limited to.

Figure 2A:
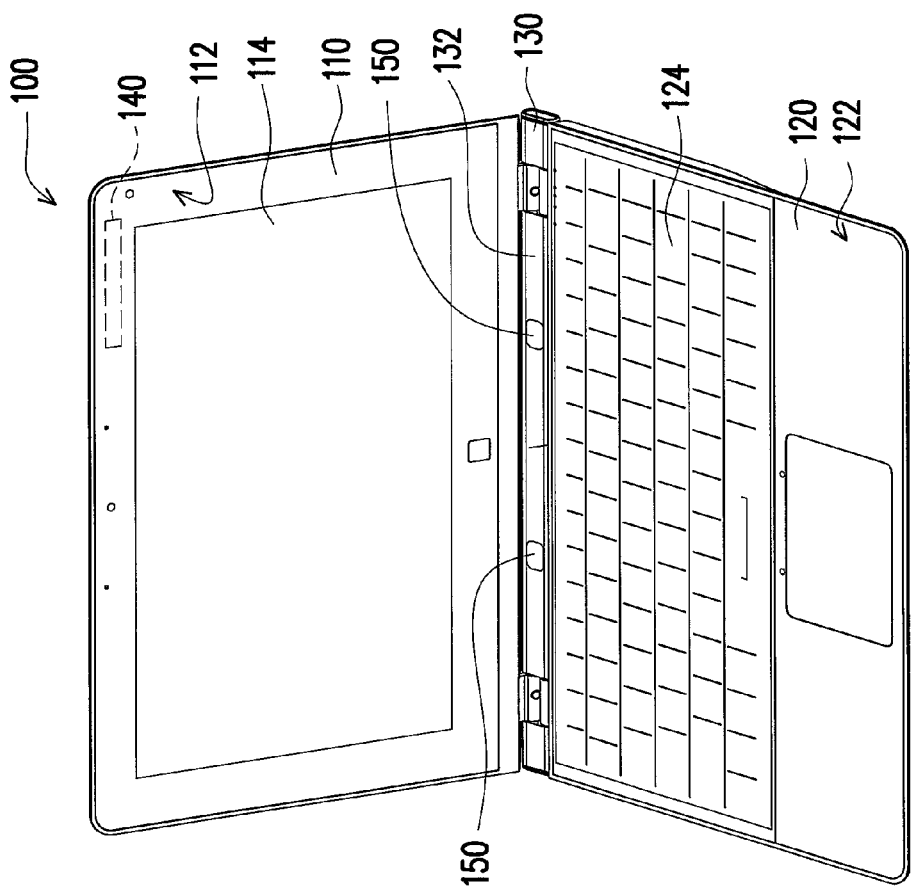
FIG. 2A is a schematic diagram of the foldable electronic device of FIG. 1A in NB mode.
Figure 2B:
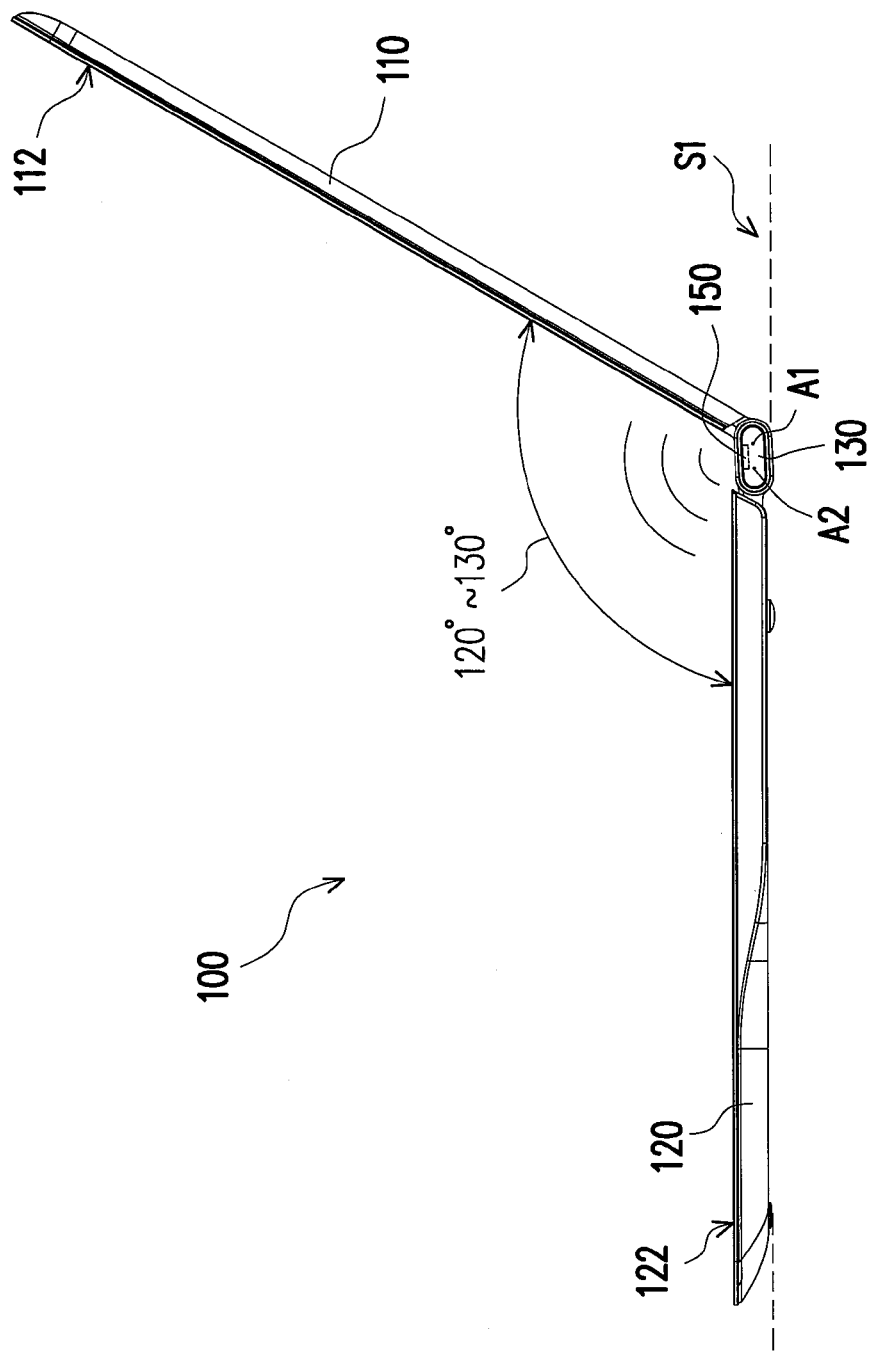
FIG. 2B is a side-view diagram of the foldable electronic device of FIG. 2A in NB mode.

FIG. 2A is a schematic diagram of the foldable electronic device of FIG. 1A in NB mode and FIG. 2B is a side-view diagram of the foldable electronic device of FIG. 2A in NB mode. Referring to FIGS. 2A and 2B, in the embodiment, the first body 110 is, for example, a tablet computer and has a display 114 at the first front surface 112; the second body 120 is, for example, a host and has a keyboard 124 at the second front surface 122. In more details, the second body 120 is configured to be placed on a plane S1. When the first body 110 rotates relatively to the second body 120 to make the included angle between the first front surface 112 of the first body 110 and the second front surface 122 of the second body 120 greater than 0° but less than 180°, the first body 110, the second body 120 and the hinge body 130 are present in NB mode. For example, the included angle between the first front surface 112 of the first body 110 and the second front surface 122 of the second body 120 is between 120° and 130°, which the disclosure is not limited to. In other embodiments, the included angle between the first front surface 112 of the first body 110 and the second front surface 122 of the second body 120 can be set as other appropriate angle. Thus, the first body 110 can be departed from the second body 120 to be used alone, or used in association with the second body 120 where the instructions can be keyed to the first body 110 through the keyboard 124 of the second body 120 and simultaneously viewing the frame displayed by the display 114.

Figure 3A:
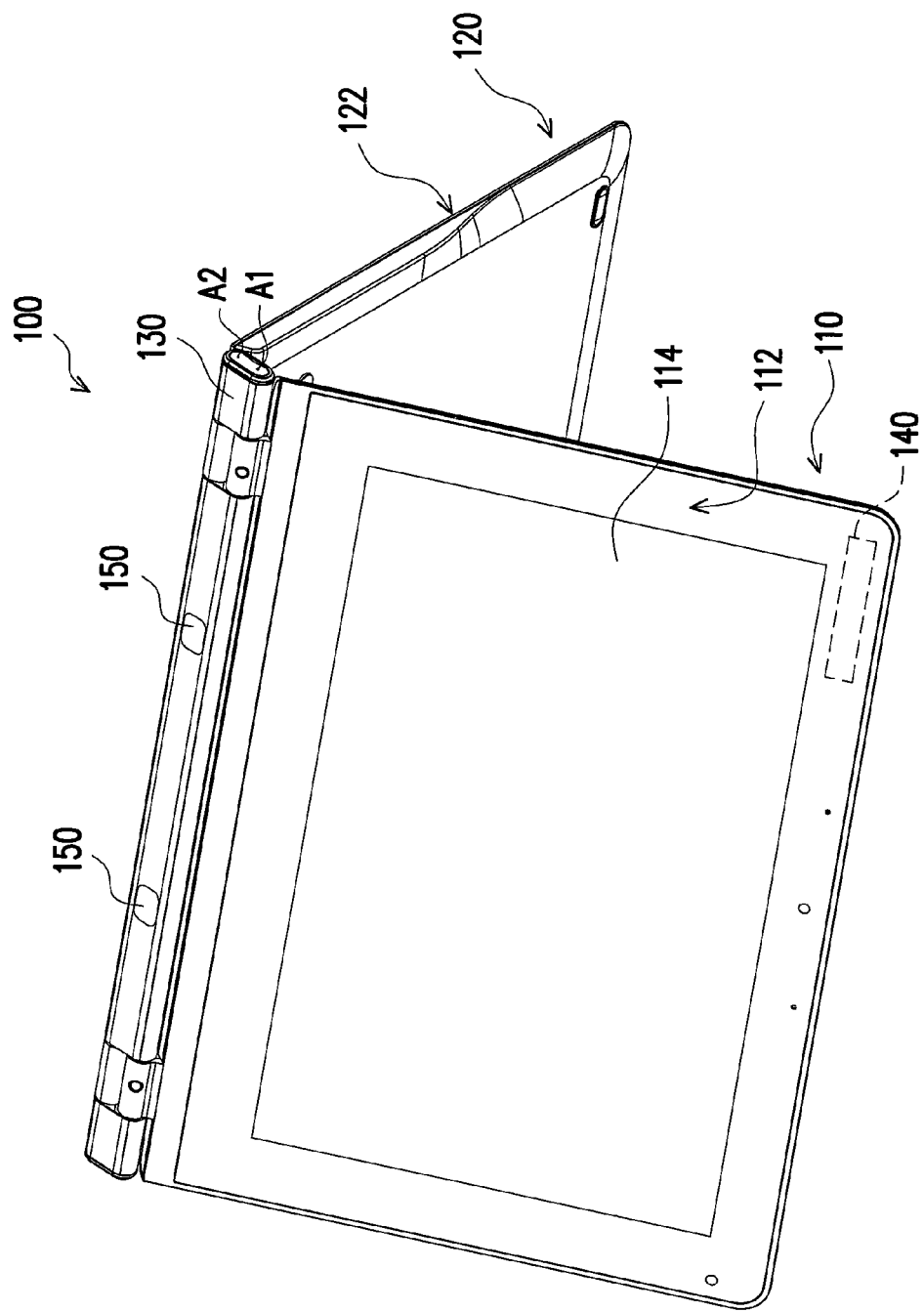
FIG. 3A is a schematic diagram of the foldable electronic device of FIG. 1A in show off mode.

FIG. 3A is a schematic diagram of the foldable electronic device of FIG. 1A in show off mode and FIG. 3B is a side-view diagram of the foldable electronic device of FIG. 3A in show off mode. Referring to FIGS. 3A and 3B, when the first body 110 rotates relatively to the second body 120 to make the included angle between the first front surface 112 of the first body 110 and the second front surface 122 of the second body 120 greater than 180° but less than 360°, the first body 110, the second body 120 and the hinge body 130 are present in show off mode. For example, the included angle between the first front surface 112 of the first body 110 and the second front surface 122 of the second body 120 is 300°, which the disclosure is not limited to. In other embodiments, the included angle between the first front surface 112 of the first body 110 and the second front surface 122 of the second body 120 can be set as other appropriate angle. Thus, the front edge 110a of the first body 110 and the front edge 120a of the second body 120 are adapted to be supported on a plane S2 so that the display 114 of the first body 110 faces the user for viewing the frame displayed by the display 114. In addition, at the time, the first body 110 can adjust the frame position of the display 114 through a software interface, so that the frame can rotate to an appropriate position with different angle of the first body 110.

Figure 4A:
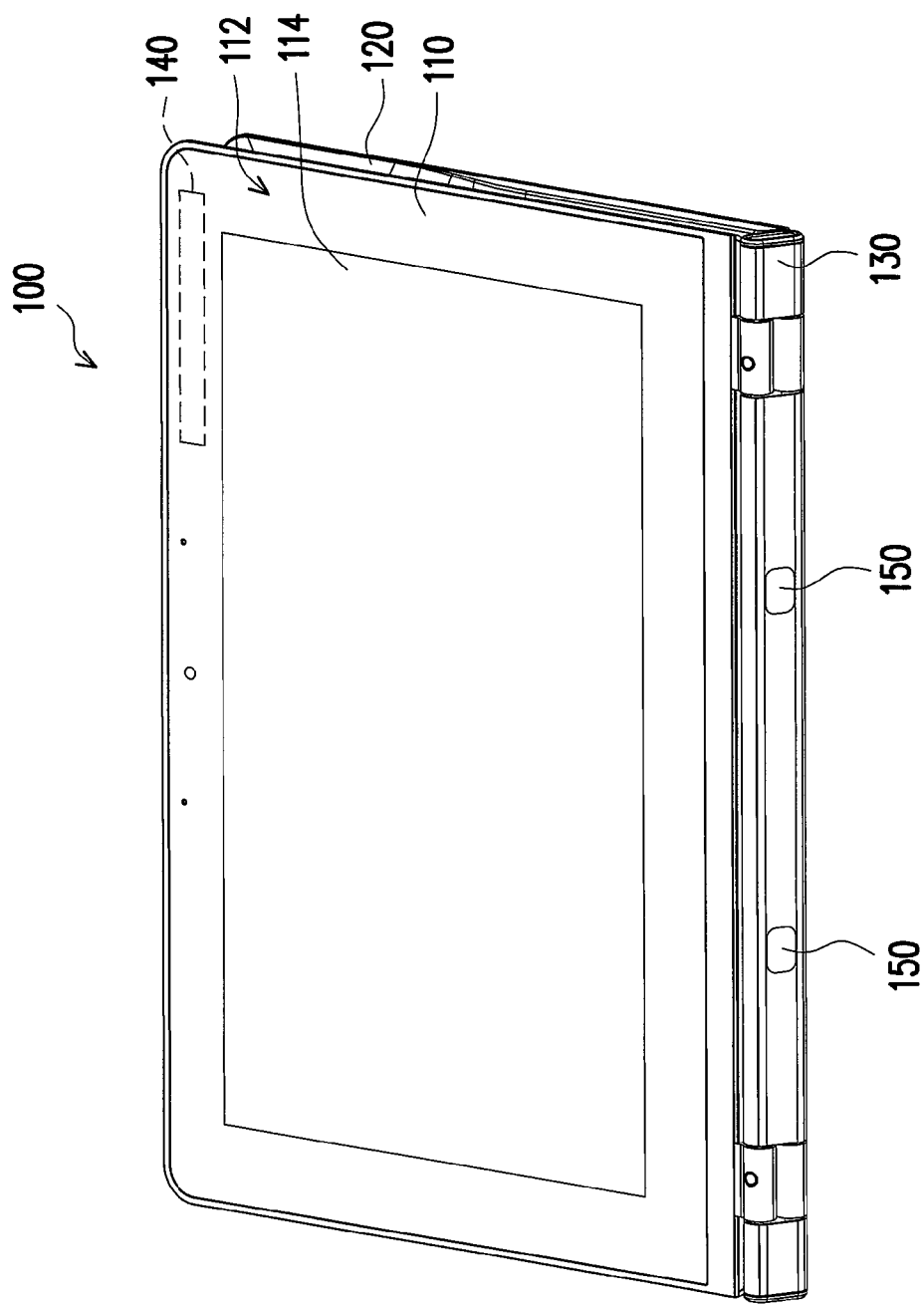
FIG. 4A is a schematic diagram of the foldable electronic device of FIG. 1A in PAD mode.
Figure 4B:
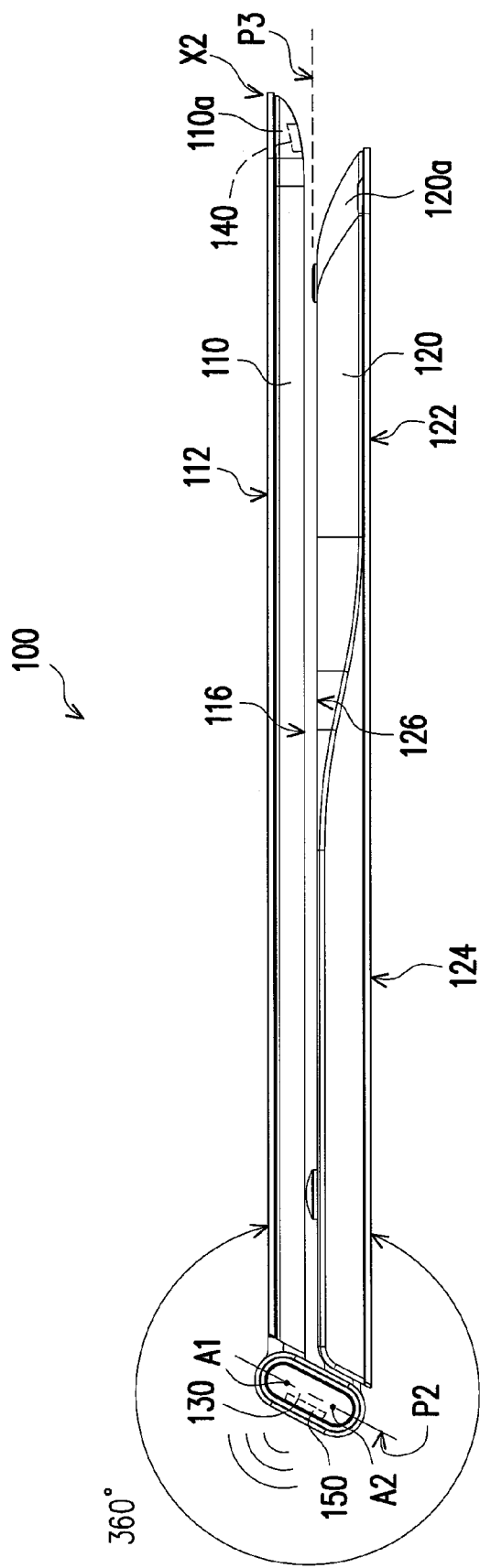
FIG. 4B is a side-view diagram of the foldable electronic device of FIG. 4A in PAD mode.

FIG. 4A is a schematic diagram of the foldable electronic device of FIG. 1A in PAD mode and FIG. 4B is a side-view diagram of the foldable electronic device of FIG. 4A in PAD mode. Referring to FIGS. 4A and 4B, in the embodiment, the first body 110 has a first back surface 116 opposite to the first front surface 112 and the second body 120 has a second back surface 126 opposite to the second front surface 122. When the first body 110 rotates relatively to the second body 120 to a second position X2, the first back surface 116 of the first body 110 is borne at the second back surface 126 of the second body 120 on a bearing plane P3, so that the included angle between the first front surface 112 of the first body 110 and the second front surface 122 of the second body 120 is equal to 360°. In this way, the first body 110 and the second body 120 can be reversely overlapped with each other and the first body 110, the second body 120 and the hinge body 130 are present in a PAD mode to allow the user performing touch operation on the first body 110, but meanwhile the second body 120 is being held or for placing. In addition, the keyboard 124 of the second body 120 at the time can be locked by pressing down a lock key or through the software interface to avoid mis-touching the keyboard 124.

In the embodiment, the foldable electronic device 100 further includes an antenna model 140. The antenna model 140 is disposed at the front edge 110a of the first body 110. When the first body 110 rotates relatively to the second body 120 to the second position X2, the pivoting plane P2 where the first pivoting axis A1 and the second pivoting axis A2 are located at and the bearing plane P3 are oblique to each other. In other embodiments, the pivoting plane where the first pivoting axis and the second pivoting axis are located at and the bearing plane are perpendicular to each other, which the disclosure is not limited to.

With the above-mentioned layout, when the first body 110 rotates to the second position X2 relatively to the second body 120, since the length of the first body 110 is greater than the length of the second body 120, the orthogonal projection of the front edge 110a of the first body 110 on the bearing plane P3 is protruded from the orthogonal projection of the front edge 120a of the second body 120 on the bearing plane P3, and thus, the antenna model 140 will not be obscured by the front edge 120a of the second body 120 to ensure good transmission effect of the antenna model 140. For the states shown by FIGS. 1A-3A, the antenna model 140 is not certainly obscured by the second body 120 or other bodies of the foldable electronic device 100 as well.

In the embodiment, the foldable electronic device 100 further includes an electronic component, i.e., a speaker 150. The speaker 150 is disposed at the hinge body 130. When the first body 110 rotates relatively to the second body 120 to the first position X1 as shown by FIG. 1B, the speaker 150 is hidden. When the first body 110 rotates relatively to the second body 120 to make the included angle between the first front surface 112 of the first body 110 and the second front surface 122 of the second body 120 greater than 0°, the speaker 150 is exposed. Therefore, in the embodiment, the speaker 150 is disposed at the hinge body 130 to make the speaker 150 outwards to face the user in the NB mode as shown by FIG. 2B, in the show off mode as shown by FIG. 3B and in the PAD mode as shown by FIG. 4B, which can increase the sound-expanding range.

In summary, in the foldable electronic device of the disclosure, by means of the pivoting axes in pairs and the oblique pivoting plane, the first body can rotate to any angle relatively to the second body. In this way, the rotation angle between the two bodies can be adjusted to provide a user with different operation modes. In addition, in the disclosure, a speaker is further disposed at the hinge body so that the speaker will not be obscured by the bodies with the rotating of the first body relatively to the second body, and the speaker can sound facing the user depending on the usage state to ensure the good audio effect of the speaker in the usage state.

It will be apparent to those skilled in the art that the descriptions above are several preferred embodiments of the disclosure only, which does not limit the implementing range of the disclosure. Various modifications and variations can be made to the structure of the disclosure without departing from the scope or spirit of the disclosure. The claim scope of the disclosure is defined by the claims hereinafter.

What is claimed is:

1. A foldable electronic device, comprising:
   a first body;
   a second body; and
   a hinge body, pivoted to the first body around a first pivoting axis and pivoted to the second body around a second pivoting axis, wherein the first body, the second body and the hinge body are three separate bodies, the first pivoting axis does not coincide with the second pivoting axis so that the first body is able to rotate to any angle relatively to the second body, wherein when the first body rotates to a first position relatively to the second body, a first front surface of the first body is closed to a second front surface of the second body on a closing plane, and a pivoting plane where the first pivoting axis and the second pivoting axis are located on and the closing plane are oblique to each other.

2. The foldable electronic device as claimed in claim 1, wherein when the first body rotates to the first position relatively to the second body, orthogonal projection of the front edge of the first body on the closing plane and orthogonal projection of the front edge of the second body on the closing plane are aligned with each other.

3. The foldable electronic device as claimed in claim 1, wherein the first body has a first back surface opposite to the first front surface, the second body has a second back surface opposite to the second front surface, when the first body rotates to a second position relatively to the second body, the first back surface of the first body is borne at the second back surface of the second body on a bearing plane, and the pivoting plane and the bearing plane are oblique to each other.

4. The foldable electronic device as claimed in claim 3, wherein when the first body rotates to the second position relatively to the second body, the orthogonal projection of the front edge of the first body on the bearing plane is protruded from the orthogonal projection of the front edge of the second body on the bearing plane.

5. The foldable electronic device as claimed in claim 4, further comprising:
   an antenna model, disposed at the front edge of the first body.

6. The foldable electronic device as claimed in claim 1, further comprising:
   a speaker, disposed at the hinge body.

7. The foldable electronic device as claimed in claim 6, wherein when the first body rotates to the first position relatively to the second body, the speaker is hidden, while when the first body rotates relatively to the second body to make included angle between the first front surface of the first body and the second front surface of the second body greater than 0°, the speaker is exposed.

8. The foldable electronic device as claimed in claim 1, wherein when the first body rotates relatively to the second body to make included angle between the first front surface of the first body and the second front surface of the second body greater than 0° but less than 180°, the first body, the second body and the hinge body are present in an NB mode.

9. The foldable electronic device as claimed in claim 1, wherein when the first body rotates relatively to the second body to make included angle between the first front surface of the first body and the second front surface of the second body greater than 180° but less than 360°, the first body, the second body and the hinge body are present in a show off mode.

10. The foldable electronic device as claimed in claim 1, wherein the first body has a display at the first front surface and the second body has a keyboard at the second front surface.

11. A foldable electronic device, comprising:
a first body;
a second body; and
a hinge body, having an electronic component, wherein the hinge body is pivoted to the first body around a first pivoting axis and pivoted to the second body around a second pivoting axis, wherein the first body, the second body and the hinge body are three separate bodies, the first pivoting axis does not coincide with the second pivoting axis so that the first body is able to rotate to any angle relatively to the second body, and when the first body rotates to a first position relatively to the second body, a first front surface of the first body is closed to a second front surface of the second body on a closing plane, and a pivoting plane where the first pivoting axis and the second pivoting axis are located on and the closing plane are oblique to each other.

12. The foldable electronic device as claimed in claim 11, wherein the electronic component is a speaker, wherein when the first body rotates to the first position relatively to the second body, the speaker is hidden, and when the first body rotates relatively to the second body to make included angle between the first front surface of the first body and the second front surface of the second body greater than 0°, the speaker is exposed.

13. The foldable electronic device as claimed in claim 12, wherein when the first body rotates relatively to the second body to make included angle between the first front surface of the first body and the second front surface of the second body greater than 0° but less than 180°, the first body, the second body and the hinge body are present in an NB mode.

14. The foldable electronic device as claimed in claim 12, wherein when the first body rotates relatively to the second body to make included angle between the first front surface of the first body and the second front surface of the second body greater than 180° but less than 360°, the first body, the second body and the hinge body are present in a show off mode.

15. The foldable electronic device as claimed in claim 11, wherein when the first body rotates to the first position relatively to the second body, orthogonal projection of the front edge of the first body on the closing plane and orthogonal projection of the front edge of the second body on the closing plane are aligned with each other.

16. The foldable electronic device as claimed in claim 11, wherein the first body has a first back surface opposite to the first front surface, the second body has a second back surface opposite to the second front surface, when the first body rotates to a second position relatively to the second body, the first back surface of the first body is borne at the second back surface of the second body on a bearing plane.

17. The foldable electronic device as claimed in claim 16, wherein when the first body rotates to the second position relatively to the second body, the orthogonal projection of the front edge of the first body on the bearing plane is protruded from the orthogonal projection of the front edge of the second body on the bearing plane.

18. The foldable electronic device as claimed in claim 17, further comprising:
an antenna model, disposed at the front edge of the first body.

19. The foldable electronic device as claimed in claim 11, wherein the first body has a display at the first front surface and the second body has a keyboard at the second front surface.

* * * * *